United States Patent [19]

Dohya

[11] Patent Number: 4,736,521
[45] Date of Patent: Apr. 12, 1988

[54] PROCESS FOR MANUFACTURING A CERAMIC MULTI-LAYER SUBSTRATE

[75] Inventor: Akihiro Dohya, El Cerrito, Calif.

[73] Assignee: NEC Corporation, Tokyo, Japan

[21] Appl. No.: 935,499

[22] Filed: Feb. 3, 1987

Related U.S. Application Data

[62] Division of Ser. No. 753,481, Jul. 10, 1985, Pat. No. 4,665,468.

[30] Foreign Application Priority Data

| Jul. 10, 1984 | [JP] | Japan | 59-143026 |
| Jul. 10, 1984 | [JP] | Japan | 59-143027 |
| Jul. 10, 1984 | [JP] | Japan | 59-143028 |
| Aug. 7, 1984 | [JP] | Japan | 59-165282 |

[51] Int. Cl.$^4$ ............................................. H05K 1/14
[52] U.S. Cl. .................................. 29/830; 29/851; 29/852; 174/68.5
[58] Field of Search ............ 29/829, 830, 831, 846, 29/847, 851, 852; 174/68.5; 361/392, 393, 395–397, 400–402, 406, 412, 414; 430/270, 312, 315, 319

[56] References Cited

U.S. PATENT DOCUMENTS

| 3,522,474 | 8/1970 | Piel | 361/414 X |
| 3,725,743 | 4/1973 | Murayama | 174/68.5 |
| 3,726,002 | 4/1973 | Greenstein et al. | 174/68.5 |
| 3,770,529 | 11/1973 | Anderson | 29/851 X |
| 3,857,877 | 12/1974 | Ahn et al. | 29/851 |
| 3,922,479 | 11/1975 | Older et al. | 430/315 X |
| 4,251,852 | 2/1981 | Ecker et al. | 361/398 X |
| 4,301,324 | 11/1981 | Kumar et al. | 174/68.5 |
| 4,336,088 | 6/1982 | Hetherington et al. | 29/851 X |
| 4,465,727 | 8/1984 | Fujita et al. | 29/851 X |
| 4,474,465 | 10/1984 | Anendola et al. | 430/312 X |
| 4,526,859 | 7/1985 | Christensen | 430/319 X |
| 4,645,552 | 2/1987 | Vitriol et al. | 29/851 X |

FOREIGN PATENT DOCUMENTS

| 0035960 | 4/1978 | Japan | 29/851 |
| 17474 | 1/1982 | Japan . | |

OTHER PUBLICATIONS

IEEE Transactions, vol. CHMT-3, No. 1, Mar. 1980, pp. 89–93, B. T. Clark and Y. M. Hill, IBM Multichip Ceramic Modules for LSI Chips–Design for Performance and Density.

IBM J. Res. Develop., vol. 26, No. 3, May 1982, pp. 286–296 C. W. Ho et al., The Thin-Film Module as a High-Performance Semiconductor Package.

*Primary Examiner*—Timothy V. Eley
*Attorney, Agent, or Firm*—Sughrue, Mion, Zinn, Macpeak, and Seas

[57] ABSTRACT

A multi-layer comprising a multi-layer glass ceramic substrate and a multi-layer wire line matrix. The multi-layer wired line matrix includes an insulating layer made from a photosensitive insulating layer, amenable to time geometry processing. The insulating layer of the multi-layer wire line matrix has a pad for accommodating variations of the locations of the through holes. The metal is plated in and fills the through holes so that the metal is not cut off at the corners. The wire line matrix is composed of a plurality of layers of a photo-lithographically formed fine conductive pattern. The glass ceramic insulating layer is also formed photo-lithographically, and is formed of the source material of the insulating layers.

8 Claims, 6 Drawing Sheets

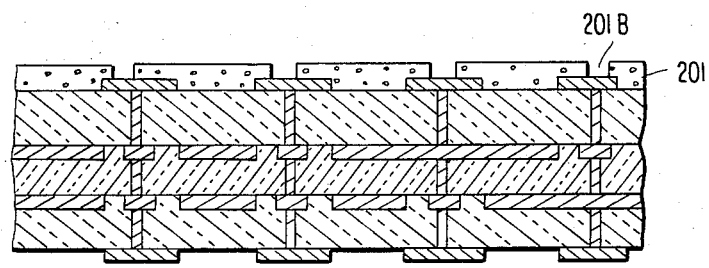
FIG. 5D
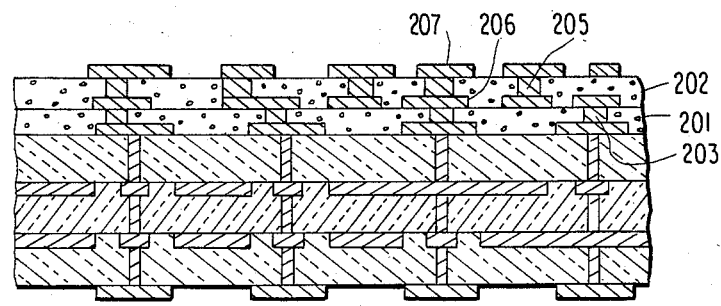
FIG. 5E
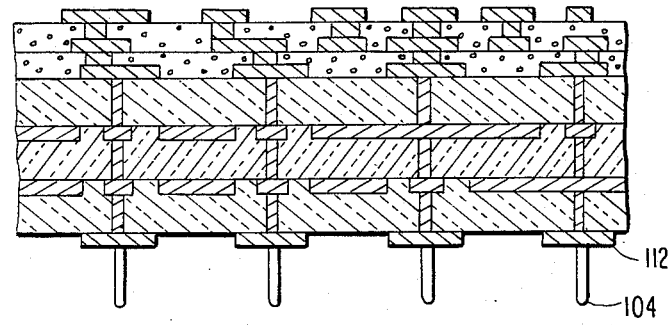
FIG. 5F
FIG. 6
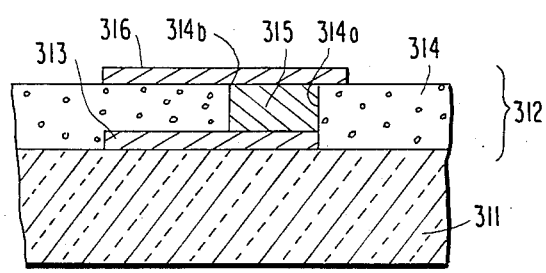
FIG. 8
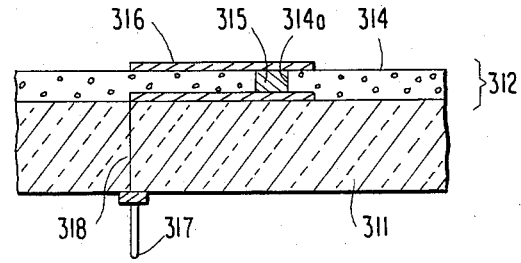

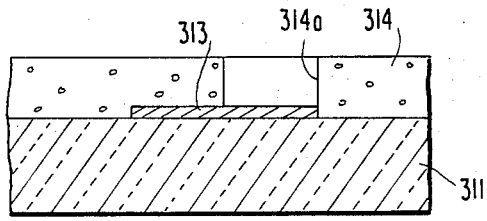
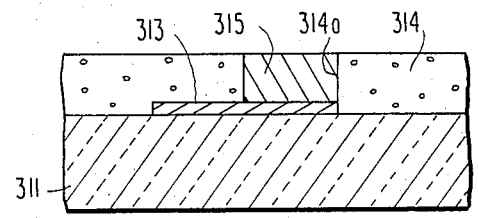
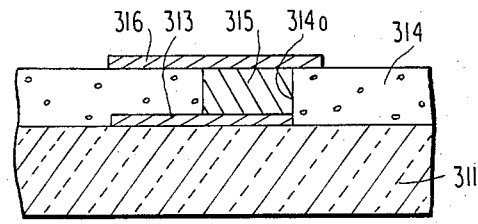
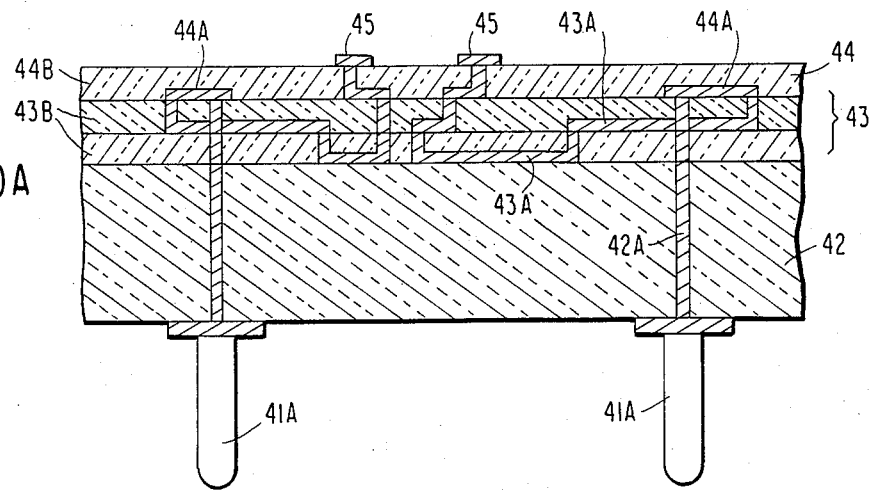
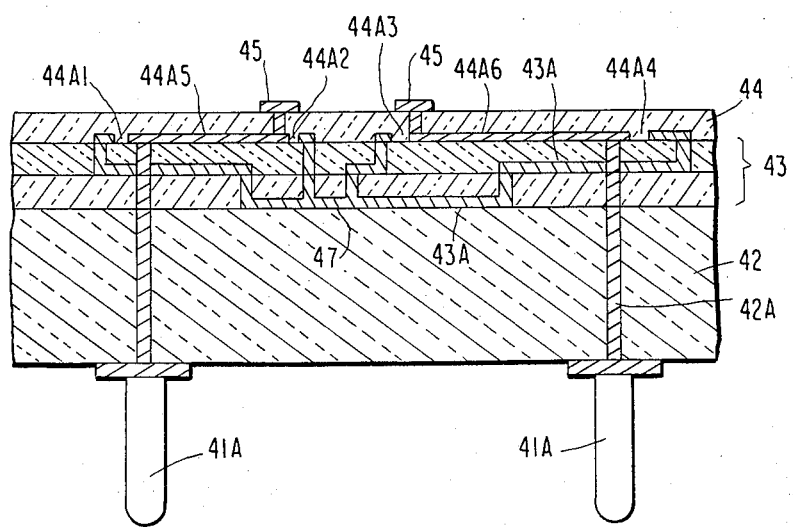

PROCESS FOR MANUFACTURING A CERAMIC MULTI-LAYER SUBSTRATE

This is a division of application Ser. No. 753,481 filed July 10, 1985, now U.S. Pat. No. 4,665,468.

BACKGROUND OF THE INVENTION

This invention relates to a module having a wired substrate and a multi-layer circuit overlaid on the substrate and a method of manufacturing the same.

The technique for realizing many LSI chips mounted on a ceramic wired substrate, the so-called multi-chip technique, has developed into the mounting technique which predominates for large scale and high speed digital systems, such as large scale computers and the like. In addition, remarkable progress in the technique of fabricating the multi-layer substrate used above has been achieved.

Various structures are already known for a high density multi-layer wired substrate. In U.S. Pat. No. 4,245,273 issued to Feinberg et al., a multi-layer substrate is formed by the method of green sheets. On the surface of green sheets, the patterns of a signal wire layer, a power source layer and a connecting layer is made by a printing method. Then all the green sheets are mounted together and the multi-layer substrate is formed by a one time sintering. This manufacturing method is, however, not suitable for fine geometry processing.

To solve this problem, a multi-layer ceramic substrate supporting thin-film lines and a VLSI chip is proposed in the technical article by C. W. Ho et al. entitled "The Thin-Film Module as a High-Performance Semiconductor Package" and appearing in IBM J. RES. DEVELOP., Vol 26, No. 3, May 1982, pp. 286-296. The module in this article does not necessarily provicde fine geometry processing on the ceramic multi-layer substrate since the multi-layer wire matrix instead can be used to obtain fine and individual patterns. One problem in such a multi-layer substrate is that the rate of contraction by sintering during the manufacturing process of the ceramic multi-layer substrate varies widely. Accordingly, a gap often occurs between the pattern for connecting to the ceramic multi-layer substrate and the pattern for connecting to the multi-layer wire matrix. Thus a defective connection can easily occur.

On the other hand, in the U.S. Pat. No. 4,245,273 and the article mentioned above, a ceramic is used for the substrate. A ceramic, for example, alumina green sheet, requires a sintering temperature of more than 1400° C. thus prompting the use of high melting point metals like tungsten or molybdenum etc. as a conductive material. The inherent electric resistivity of such a metal is higher than that of metals like gold, silver, or palladium. As a result, the problem arises that it is difficult to reduce the value of the power wire resistance in the ceramic substrate. Furthermore, in the case that the multi-layer wire matrix is formed on top of the ceramic substrate, when tungsten or molybdenum is sintered in air at more than 400° C., the tungsten or molybdenum is oxidized and thus cannot be used as a conductive layer. Accordingly, the process and material for manufacturing multi-layer wire matrices are greatly limited.

Furthermore, for the multi-layer wire matrix, an insulating layer is inserted between upper and lower conductive layers. The electric connection between the upper conductive layer and the lower conductive layer is realized by forming the upper conductive layer on the side of a via hole formed in the insulating layer and the via hole directly connects the upper and lower conductive layers. However, in the multi-layer wire substrate, the thickness of the portion of upper conductive layer at the corner between the upper surface of the insulating layer and the side of the via hold is reduced and becomes so thin that a portion of the upper conductive layer is likely to be cut off from the conductive layer in the via hole.

Next is described a method for fixing a defective portion. A test of the defective signal wire line is possible either at the time of completing the printing of the green sheet or of completing the fabricating of a multi-layer substrate. The check at the completion of printing of the green sheet can be performed optically but an electrical check is impossible because the green sheet is not conductive before sintering. When the multi-layer substrate is completed it is possible to check electrically. However, fixing the defect is not possible in an interior layer of the completed substrate, and it is thus necessary to fix the defect from outside of the substrate. One example of this technique is proposed in an article contributed by Bernard T. Clark et al. to IEEE TRANSACTIONS ON COMPONENTS, HYBRIDS, AND MANUFACTURING TECHNOLOGY, Vol. CHMT-3, No. 1, March 1980, pp. 89-93, under the title of "IBM Multi-Chip Multi-layer Ceramic Modules for LSI Chips—Design for Performance and Density". In the article, fixing of this kind of substrate is done by wiring to pads of a connecting layer on the surface of the substrate. Such a method causes the problems that the reliability of connection is degraded, the number of fixing lines are increased, a great amount of labor for wiring is needed, and the area for mounting elements is reduced by preparing the area for wiring.

SUMMARY OF THE INVENTION

It is therefore an object of the present invention to provide a multi-layer substrate which is able to avoid the defective connections caused by the variation of the rate of contraction.

It is another object of this invention to provide a multi-layer substrate which is free from the limitation of the prior manufacturing process and materials.

It is still another object of this invention to provide a multi-layer substrate which is free from the cut-off of the wire line corresponding to the via hole.

It is a further object of this invention to provide a more reliable multi-layer substrate.

According to one feature of the present invention, there is provided a multi-layer substrate comprising a ceramic multi-layer. The conductive layer covers the through hole on the surface of the substrate. A multi-layer wire matrix is formed on the conductive layer and the substrate.

According to another feature of the present invention, there is provided a multi-layer substrate with a multi-layer wire matrix comprising an upper conductive layer and a lower conductive layer. The insulating layer is located between the upper and lower conductive layers and has a via hole which is metal plated.

According to still another feature of the present invention, the steps of forming the multi-layer substrate comprise the steps of forming a ceramic multi-layer substrate by sintering the green sheet laminating substrate having through hole wiring, forming a conductive layer on the surface of the ceramic multi-layer substrate, and forming an insulating layer so that it covers the desired portion of the conductive layer and the desired portion of the surface of the ceramic multi-layer substrate.

According to yet another feature of the present invention, there are provided the steps of forming an insulating layer with the via hole corresponding to the desired portion of the lower conductive layer, filling up the via hole with the metal for electrically connection to the lower conductive layer by plating, and then forming an upper conductive layer for electrically connecting to the filled up via hole.

BRIEF DESCRIPTION OF THE DRAWING

FIGS. 5A–5F, show in schematic vertical section, the steps of manufacturing the module depicted in FIGS. 3 and 4;

FIG. 6 is a schematic vertical sectional view of a module according to a third embodiment of the present invention;

FIGS. 7A–7C show, in schematic vertical section, one example of the steps of manufacturing the module depicted in FIG. 6;

FIG. 8 shows, in schematic vertical section, another example of the steps of manufacturing the module depicted in FIG. 6;

FIGS. 10A and 10B show, in schematic vertical section, another example of the steps of fixing the module.

DESCRIPTION OF THE PREFERRED EMBODIMENTS

Figure 1:
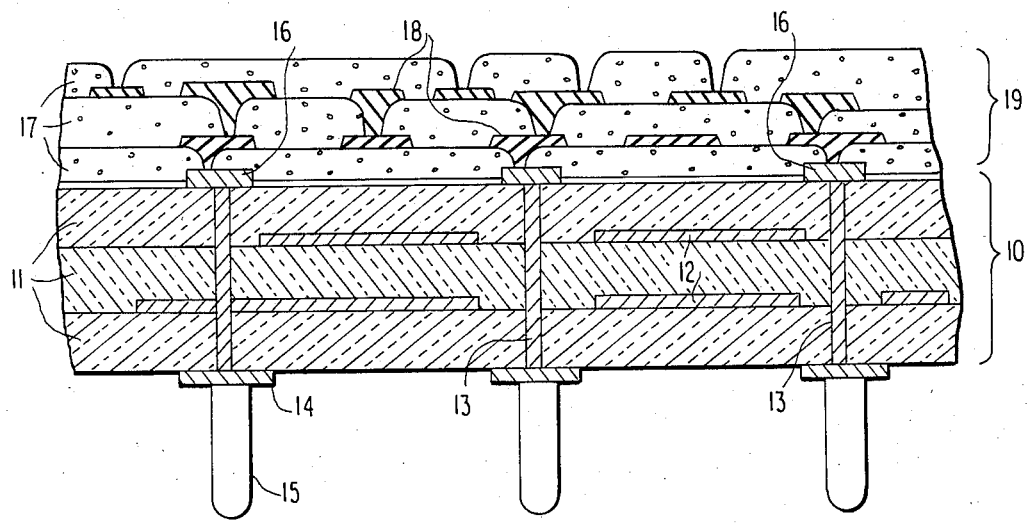
FIG. 1 is a schematic vertical sectional view of a module according to a first embodiment of the present invention.

Referring to FIG. 1, a module according to a first embodiment of the present invention comprises a ceramic multi-layer substrate 10 and a multi-layer wire line matrix 19. The ceramic multi-layer substrate 10 has three alumina substrates 11, on respective ones of which inner power and ground layers 12 are printed with a paste made of molybdenum or tungsten, and then they are fired and sintered after lamination of all the alumina substrates 11. There are several methods to form metal connecting pads 16. For example, the metal pads 16 can be formed by evaporation or sputtering, or plating the metal on top of already evaporated or sputtered metal. Also, there is the thick film method. In this embodiment, the shape of the metal connecting pad 16 is a disk of 1 mm diameter, and comprises a titanium layer of 0.1 $\mu$m thickness and a palladium layer of 3 $\mu$m thickness. Chromium, aluminum, or nickel can be used in place of titanium or palladium. Insulating layers 17 are formed on the surface of the substrate having the metal connecting pad 16. The insulating layers 17 and wire lines 18 are laminated on the other insulating layers 17 and wire lines 18, respectively, so that a multi-layer wired line matrix 19 is formed. In this embodiment, the material of the insulating layers 17 is polyimide and the principal ingredient of the material of the wire lines 18 is gold (Au). The thickness of each of the insulating layers 17 is 15 $\mu$m, and the thickness of each layer of the wire line 18 is 5 $\mu$m. The area of the via hole formed in the insulating layer 17 is square and 40 $\mu$m on a side. The minimum width of a pattern of a wire line 18 is 20 $\mu$m.

The advantage of this embodiment is as follows. First, the variability of location caused by the variation of the rate of contraction of the ceramic multi-layer substrate 10 is allowed for by use of the large metal connecting pad and this connection defect is prevented. Furthermore, it is not necessary to enlarge the diameter of the through hole 13. For example, in the case of a large substrate of 100 $\mu$m on a side, the filling up of the through hole 13 of the ceramic multi-layer substrate 10 is easily performed so that the via portion is easily formed.

Next, as the diameter of the through hole 13 can be reduced, the remaining area of the substrate 10 can be usefully and densely used for interior power and ground layers 12. Then, as the metal connecting pad 16 is formed to cover the through hole 13 of the substrate 10, the subsequent steps for manufacturing thin film do not affect the metal of the through holes 13, so that it can be protected within the interior for increased reliability.

Also, as polyimide is used as the insulating material between layers of thin film wire matrix 19 and since titanium, chromium, aluminum, nickel or palladium is used as the material of the metal pad 16, the embodiment can obtain high connection reliability and high insulation between layers.

Figure 2A:
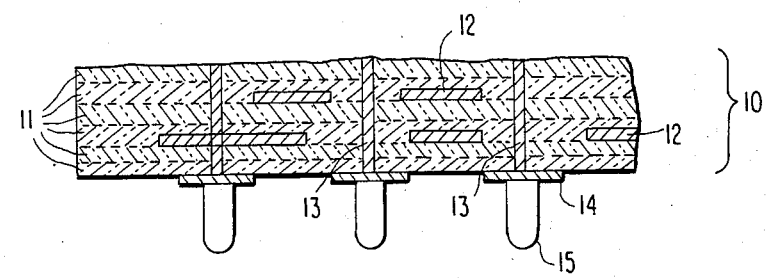
FIGS. 2A to 2E show in schematic vertical section, steps of manufacturing the module depicted in FIG. 1.

Now, the manufacturing method of the first embodiment mentioned above will be explained with reference to FIGS. 2A–2E. Referring to FIG. 2A, the ceramic multi-layer substrate 10 is formed by the normal green sheet method, here illustrated with six green sheets 11. After the inner power and ground layers 12 and the metal of the through hole 13 are formed on the desired sheets of the six sheets of green sheet alumina substrate 11, all the sheets 11 are laminated. After that, the sheets 11 are fired and sintered in a reducing atmosphere at more than 1400° C. A thick film paste of tungsten or molybdenum is used as the material of the inner power and ground layers 12 and the metal of the through hole 13. Next, lands 14 are fixed to the reverse side of the substrate 10, and the pins 15 are fixed on each of the lands 14 by silver solder.

Next, the formation of the multi-layer wired matrix on the substrate wall be explained. There are two problems in this formation. One problem is the possible undulation of the surface of the substrate 10, and the other problem is that the pitch of the through holes is different from one another in each of the substrates.

Figure 2B:
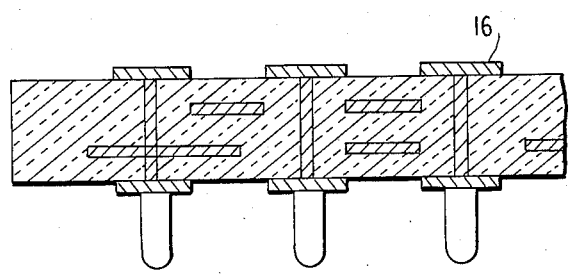

The two problems obstruct the formation of the multi-layer wire matrix. Referring to FIG. 2B, to solve the first problem, the surface of the substrate 10 is polished to be flat and then the metal connection pad 16 is formed. In the case that the maximum distance from the edge of one through hole 13 to the edge of another through hole 13 is 100 mm (the lateral dimension of the entire module) and the variation of the rate of contraction by sintering is ±0.5%, the variation of the maximum distance between through holes 13 is ±0.5 $\mu$m. In this embodiment, to take this variation into account, the diameter of the metal connecting pad 16 is set to 1 mm. The pad 16 is formed by an etching method after titanium of 0.1 $\mu$m and palladium of 3 $\mu$m are deposited by sputtering on top of the substrate 10.

Figure 2C:
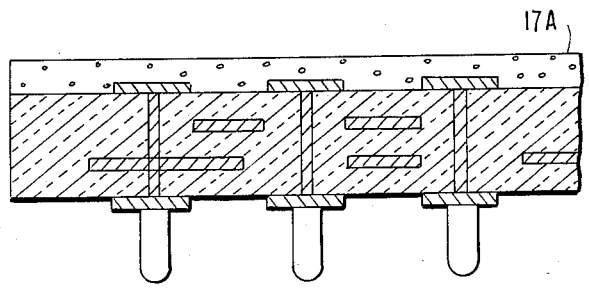

Referring to FIG. 2C, a pre-polyimide varnish 17A is coated on the substrate 10 including the pads 16. The coating can be accomplished by a spray method or a spin coating method. The thickness of varnish 17A is about 20 μm. In this embodiment, photonese sold by Toray is used as the pre-polyimide varnish 17A. As the varnish is photosensitive, it is not necessary to use photo-resist in the following step for forming a via-hole.

Figure 2D:
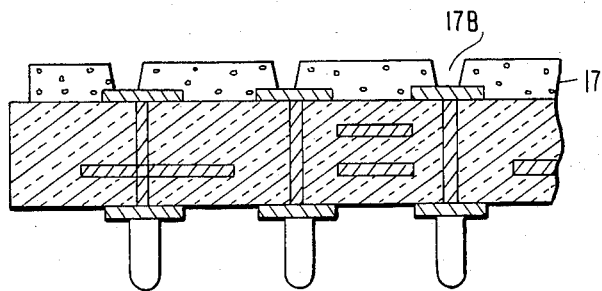

Referring to FIG. 2D, after the coated varnish 17A is dried at 60° C. for sixty minutes, the varnish 17A is exposed and developed, so that via holes 17B are formed. Next, the pre-polyimide varnish 17A is cured under the condition that a first thirty minutes of curing are at 200° C. and a second thirty minutes are at 400° C. As a result, a polyimide insulating layer 17 with via holes 17B is established. The thickness of the insulating layer 17 is 15 μm.

Then a conductive layer 18 is formed into the via holes 17B and on top of the insulating layer 17. For example, after chromium of 0.1 μm and palladium of 0.2 μm thickness is formed by a sputtering method, gold is selectively plated on the desired portion of the gold pattern. The thickness of the gold plating is, for example, 15 μm in the via holes, and 5 μm on the insulating layer. The minimum width of the via hole 17B is 40 μm and the minimum width of the wire line 18 is 20 μm.

Figure 2E:
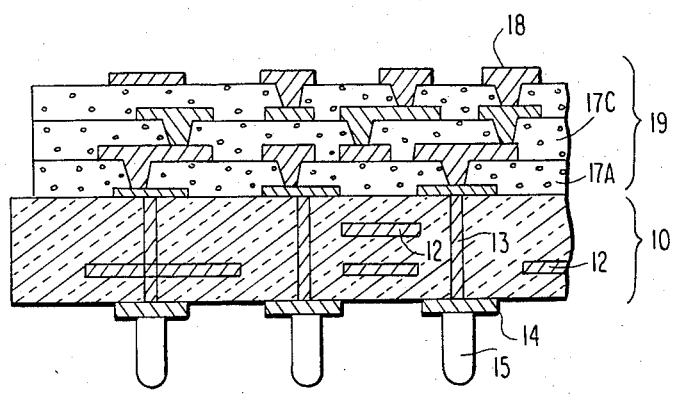

Referring to FIG. 2E, after forming the conductive layer 18, another polyimide insulating layer 17C is formed. This step is repeated, so that the multi-layer wire matrix 19 is formed on the substrate 10 having the pins 15. In the described embodiment although polyimide is used as an organic resin, instead an epoxy resin, Teflon sold by Du Pont, melamine resin, or phenol resin could be used as the organic resin in this invention.

A second embodiment of the present invention will now be explained with reference to FIG. 3.

Figure 3:
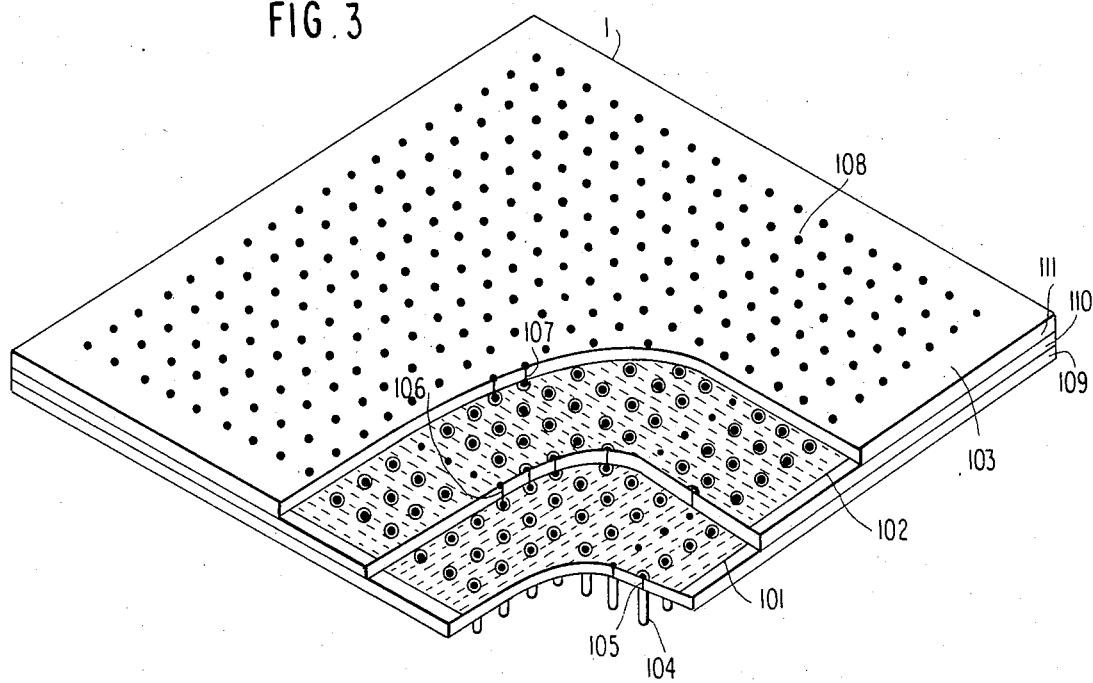
FIGS. 3 and 4 are schematic vertical sectional views of a module according to a second embodiment of the present invention.

FIG. 3 shows the glass-ceramic substrate, which can be fired and sintered at less than 1400° C., and corresponds to the substrate example of the present invention. FIG. 3 illustrates a glass ceramic substrate 1, including a first power wire line layer 101, a second power wire line layer 102 and a surface layer 103. Terminals 104 are connected through first through holes 105 in the first power wire layer 101. Second through holes 106 and third through holes 107 pierce other layers. Surface exposed parts 108 of the third through holes 107 appear at the surface. The through holes 105, 106 and 107 pierce respective green sheets 109, 110 and 111, which are laminated during the manufacture of the glass ceramic substrate 1. The glass ceramic substrate 1 can be fired and sintered at less than 1400° C. in air. The green sheets 109, 110 and 111 of the substrate 1 can be made from the inorganic composition shown in Japanese Kokai No. 57-17474, published on Jan. 29, 1982.

Figure 4:
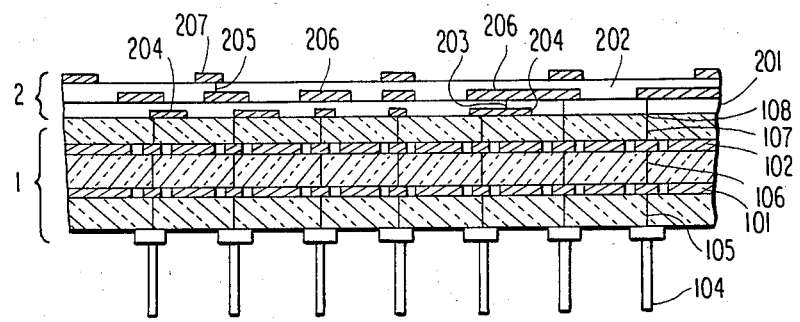

Referring to FIG. 4, a multi-layer wire line matrix 2 uses inorganic insulating material made from photo-sensitive insulating paste and comprises a first inorganic insulating layer 201, a second inorganic insulating layer 202, a first via hole wire line 204, a second wire line 206 and a third wire line 207. The wire line matrix 2 is formed on the ceramic substrate 1 because the terminal 104 on the substrate is connected to the terminals of power on a number of IC chips, and the wire line matrix 2 interconnects this number of IC chips mounted on its surface. The first via holes 203 are provided for connecting the first wire lines 204 with selected second wire lines 206. Each of the second via holes 205 is provided for connecting each of the second wire lines 206 with selected ones the third wire lines 207. Each of the first wire lines 204 connects each of the exposed parts 108 of the through hole wire lines in the ceramic substrate 1 with a corresponding first via hole wire line 203. The wiring paste and the photo-sensitive insulating paste, which can be fired and sintered at 700° C. to 900° C. are used to form the inorganic wire line matrix 2.

The reason for manufacturing according to the above method is as follows. The ceramic substrate 1 is made by printing the conductor made of high melting point metal, for example, tungsten, on the alumina green sheet 105, 106 or 107 and firing and sintering at 1400° C. in a reducing atmosphere. Thus such a substrate is made from a material which is easily oxidized, like tungsten or molybdenum. Accordingly, it is impossible to form the wire line matrix 2 and its insulating layers 201 and 202 by sintering in oxidizing air on the already sintered substrate. On the other hand, when the glass ceramic substrate 1 according to the present invention is used for the main component, the substrate 1 itself is fired and sintered at 700° C. to 900° C. in air. After that, it is possible to attach the insulating layers 201 and 202 and the wire lines 204, 206 and 207 in air.

The signal wire lines 204, 206 and 207 in the module are made according to the present invention by a thin film technique. The reason is because the thin film technique is able to form the wire line with finer geometry than that available with a thick film, so that a higher number of wire lines can be realized with many fewer wire line layers. For example, the thin film wire line is formed by a plating technique of gold wiring incorporating photo-lithography, after titanium and palladium are formed by sputtering as a base metal thick film. For such a line, a material, such as gold, of low electrical resistance which is unoxidized in the sintering process in air, can be used. As a result, the wire line has an advantage that its time constant and signal transmission delay can be reduced. For making the best use of the advantage of such a thin film wiring technique, the via hole of the insulating layer must be also made of fine geometry.

In this invention a photo-sensitive insulating paste is used for the following reason. If this photo-sensitive material is used, photo-lithographic techniques can be used for forming the via holes. Accordingly, it is possible to form the via hole, the size of which is 20% to 25% of the size of a via hole made by normal screen printing. The step of firing and sintering in air is necessary for burning out completely the photo-sensitive element used in the photo-sensitive insulating paste. In this embodiment, because the gold, silver or palladium alloy can be used as a conductive material, it is possible to eliminate the photo-sensitive element. The main component of the glass ceramic is $SiO_2$ and $Al_2O_3$, while secondary components include PbO, $B_2O_3$, BaO, CaO, ZnO and MgO.

Figure 5A:
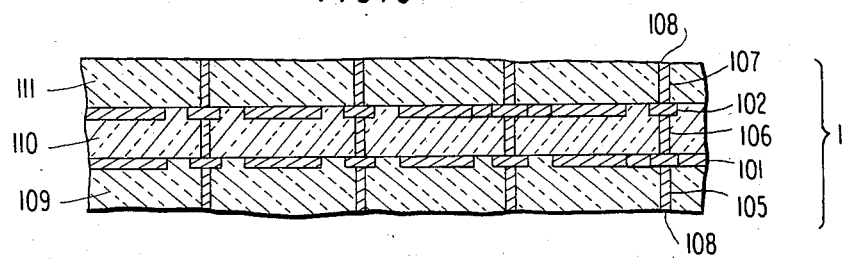

Next, the manufacturing method for the second embodiment mentioned above will be explained. Referring to FIG. 5A, the glass ceramic substrate 1 is formed. For example, the inorganic composition shown in Japanese Kokai No. 57-17474 is used as the material of the substrate 1. First the holes for through holes 105, 106 and 107 are punched into each of the green sheets 109, 110, 111. A thick film conductive paste, including gold, silver or palladium alloy as its main component, is filled into the through hole punched in each of the sheets. Next, the first power wire line layer 101 is printed on the surface of the green sheet 109 and the pad for forming the terminal 104 is printed on the reverse side of the green sheet 109. The second power wire line layer 102 is printed on the surface of the green sheet 110. Next, all the green sheets 109–111 are laminated after registering and then forced together with a press. After that, the laminated green sheets are fired and sintered at 700° C. to 900° C. in air. In this step, the ceramic substrate 1 is formed from the green sheets 109–111, and the conductive paste is fired to form wire lines in the through holes 105 to 107. The exposed parts 108 of the through hole wire lines 107 are formed on the surface and reverse side of the ceramic substrate 1. The front and back surfaces of the ceramic substrate 1 are very uneven because of the state of the wire lines in the through hole 107 that have been fired and sintered following the printing, as described above. Accordingly, it is necessary to polish the front and rear surfaces of the ceramic substrate 1 after firing and sintering. As a result, the surfaces of the substrate including the through hole wire lines are made smooth. The formation of the multi-layer wired matrix and the land on the surface of the substrate is thus facilitated.

Figure 5B:
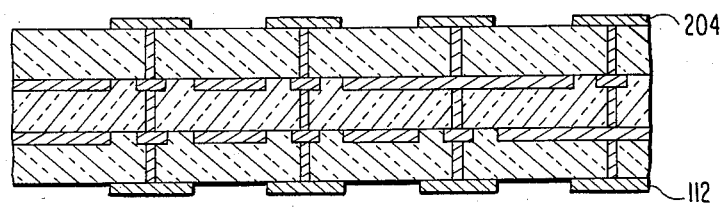

Referring to FIG. 5B, after polishing, the first wire line layer 204 is formed on the surface of the substrate and the land 112 for the terminal pin is formed on the reverse side of the substrate. After titanium and palladium of 0.1 μm thickness is formed by sputtering as a base metal for the layer 204 and the land 112, the layer 204 is obtained on the desired parts of the substrate 1 by gold plating. The thickness of gold is 3 to 5 μm.

Figure 5C:
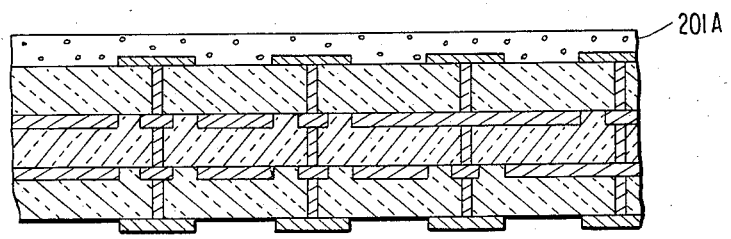

Referring to FIG. 5C, the photo-sensitive insulating paste 201A is uniformly coated by a printing process on the surface of the substrate 1 having the first wire line layer 204. For example, NTP sold by Tokyo Ouka Company can be used as the photo-sensitive insulating paste 201A. The thickness of the paste 201A is about 30 μm after drying and the paste 201A is applied with a stainless steel screen of 150 mesh.

Referring to FIG. 5D, the via hole 201B is obtained by the patterned exposure and development after drying at 85° C. for twenty minutes. The photo-sensitive insulating paste has a photo-sensitive character and high resolving power. It is not necessary to use photo-resist in the step of the exposure and development because of the use of the photo-sensitive paste. In the embodiment, it is relatively easy to make the via hole, the minimum diameter of which is 80 μm. Next, the paste is fired and burned at 700° C. to 900° C. in air to be the inorganic insulating layer 201. The thickness of the layer 201 after firing and sintering is about 20 μm.

Referring to FIG. 5E, the first wire lines 203 for via holes are formed by filling up the via holes with thick film paste or by plating gold. The second wire line 206, the second insulating layer 202, the second wire line for via hole 205, and third wire line 207 are formed by repeating the steps mentioned above. The minimum width of the wire line is 50 μm. Next, referring to FIG. 5F, the pin 104 is fixed to the land 112 by use of silver solder.

Now, the third embodiment of the present invention will be explained. The module shown in FIG. 6 includes a substrate 311 and a multi-layer wire line matrix 312 formed on the substrate 311. The multi-layer wire line matrix 312 comprises an under conductive layer 313 formed on the substrate 311; an insulating layer 314 with via holes 314a corresponding to the desired parts of the layer 313, formed on top of the substrate 311 including the layer 313; a conductive layer 315 formed by filling up the via holes 314a by metal plating; and an upper conductive layer 316 formed on the surface of the insulating layer 314 including the surface of the conductive layer 315. The upper conductive layer 316 is electrically connected to the under conductive layer 313 via the conductive layer 315.

By the structure mentioned above, the upper conductive layer 316 is not cut off in the part of the upper layer 316 corresponding to the corner 314b between the side wall of the via hole 314a and the surface of the insulating layer 314, thus protecting against cut off.

Now one example of the method for manufacturing the third embodiment of the present invention will be explained. Referring to FIG. 7A, the under conductive layer 313 is formed on the substrate 311. Then the insulating layer 314 with via holes 314a is formed on the parts corresponding to the desired parts of the upper conductive layer 313. Referring to FIG. 7B, the conductive layer 315 is formed by filling up the via 314a hole of the insulating layer 314 by metal plating. In the case that the plating method is a non-electrolytic plating method, the combination of the metal for the under conductive layer 313 and the plating metal is limited. Copper, nickel or gold can be practically used as a plating metal. Examples of the combination of the metal for the under conductive layer 313 and the plating metal are shown in the following table.

| metal for the conductive layer 313 | copper | nickel | palladium |
|---|---|---|---|
| plating metal (non-electrolysis) | copper | nickel gold | nickel |

As it is not necessary to provide electric paths for non-electrolytic plating, the operation is more efficient than that of electrolytic plating. On the other hand, although for electrolytic plating, the choice of metal to be used for plating is wider than that for electrolytic plating, electrolytic plating requires that the parts to be plated be used as electrodes in order to provide electrical connectivity as an electrode. In any case, the central feature of the embodiment is to utilize the insulating layer 314 itself as a plating resist. As the metal is filled up into only the via holes 314a of the insulating layer 314 by selective plating, it is not necessary to use a special resist.

By adopting the steps, the step for forming the conductive layer 315 (via hole parts) is reduced, and it produces perfect self alignment which plates to only the via holes. Accordingly, the occurrence of the problem of the formation of a gap between the via holes 314a and conductive layer 315 can be reduced.

Referring to FIG. 7C, the upper conductive layer 316 is formed on the insulating layer 314 to connect with the conductive layer 315 in the via hole 314a. As the plated metal fills up the via holes 314a, almost all of the surface of the conductive layer 315 is even. Accordingly, the cutting off of the upper conductive layer 315 can be eliminated.

FIG. 8 is a cross sectional view showing another example of the method for manufacturing the third embodiment according to the present invention. In this method, a through hole 318, connected between terminal 317 at the one edge of the hole 318 and the under conductive layer 313 at the other edge of the hole 18, is formed on the substrate 311. The other elements are the same of the other method for the third embodiment, and the same reference numbers are used for corresponding elements. The conductive layer 315 in such a configuration of the multi-layer wire line substrate can be formed by electrolytic plating. At that time, the through holes 318 and the terminals 317 are utilized. The conductive layer 315 is formed by filling up the via holes 314 by metal plating while the cathode is the under conductive layer 313 connected to the terminal 317 by the through hole 318. Also, in this case, the insulating layer 314 functions as a plating resist, so that only the via hole 314a is plated.

Figure 9A:
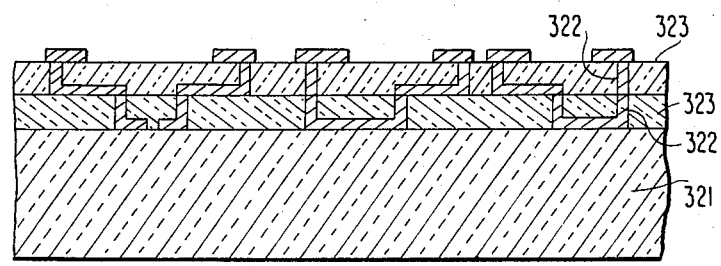
FIGS. 9A–9C show, in schematic vertical section, one example of the steps of fixing the module.

Next, one example of the method for fixing the module according to the present invention will be explained with reference to FIGS. 9A to 9D. Referring to FIG. 9A, the conductive layers 322 and the insulating layers 323 are alternatively laminated so that a multi-layer wire line matrix is formed. There are two typical methods to form the conductive layer 322. One way is a substractive method. After a metal film is formed on the entire surface, only the desired portion is covered by photo-resist and the other parts are etched away. The other way is an additive method in which metal film is put only on the desired portion by photo-resist. This described embodiment uses the subtractive method. Of course, the additive method can be used in the present invention. High molecular resin film like $SiO_2$, $Si_xN_y$ and polyimide, or a fired glass and alumina film can be used as the insulator 323. In the embodiment, polyamide film is used.

Figure 9B:
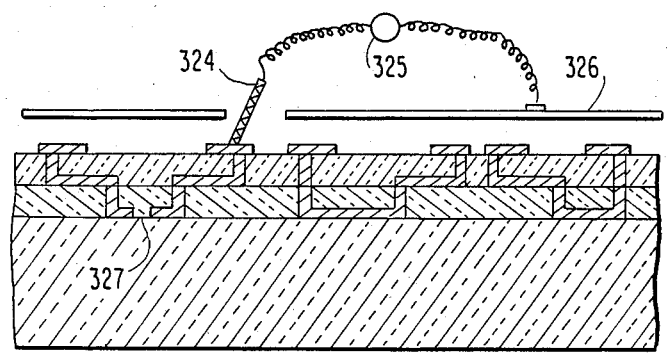

Referring to FIG. 9B, the signal line in the multi-layer wire line matrix is inspected by a contact method. In the embodiment, a probe 324 sequentially contacts each of the terminals of the signal wire lines. This method measures the electrical capacitance between the opposite electrode 326 and the contacted signal wire line. The feature of this method is that only one inspection probe 324 is used. A cut off or a short circuit of the signal wire line can be detected by measuring the electrical capacitance, if the electrical capacitance is proportional to the length of the signal wire line. This proportional relationship can be obtained to a good approximation by using a suitable shape and material for the opposite electrode 326. For example, FIG. 9B shows the case of cut off portion 327.

Figure 9C:
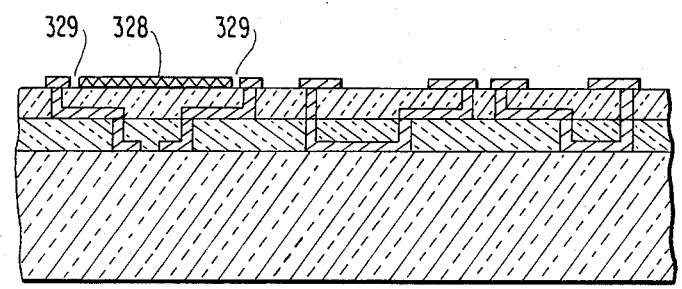

Referring to FIG. 9C, a fixing signal wire lines 328 having the same connecting function as the non-defective signal wire line, is formed on the multi-layer signal wire line matrix. For example, the method for forming the firing line 328 is as follows. A metal film is formed on the entire surface of the multi-layer signal wired line matrix. Next, photo-resist is coated thereupon. Then, based on the inspection of the previous step, the fixing wire line pattern corresponding to the signal wire line is exposed by a direct scanning exposure unit, that is, direct writing is used. The photo-resist is thus selectively exposed and polymerized. The remaining metal film under the photo-resist is not etched away. Finally, the photo-resist is peeled off or removed and the fixing signal wire line 328 made of the metal film is formed. If necessary, a defective wire line is disconnected from the fixing wire line 328 by cutting off of the defective wiring terminal. FIG. 9C shows two examples of a cut off portion 329.

Figure 9D:
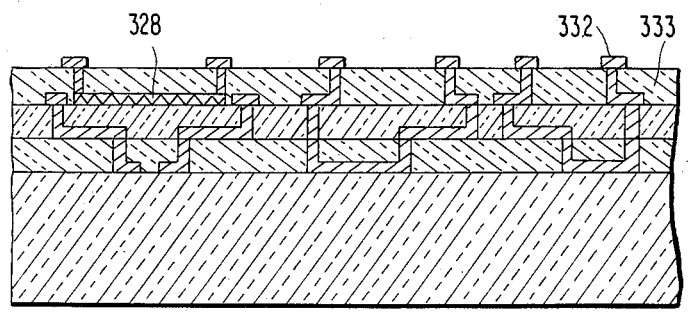

Referring to FIG. 9D, another conductive layer 332 and another insulating layer 333 are formed on the fixing signal wire line 328. The conductive layer 332 provides pads for mounting LSI chips. The same functional connectivity pattern can be obtained by using the fixing signal wire line 328 in place of the defective line 322.

Next, another example of the method for fixing the module according to the present invention will be explained with reference to FIGS. 10A and 10B. FIG. 10A shows the non-defective structure while FIG. 10B shows an example of a short-circuited structure, as exemplified by a short 47. A comparison of these two structures will clarify the function of fixing wire line layer. A multi-layer signal wire line matrix 43 is formed on the surface of a multi-layer ceramic substrate 42 in both FIGS. 10A and 10B. The multi-layer signal wire line matrix 43 can be obtained by alternatively laminating conductive layers 43A and insulating layers 43B. Then, the integrity of the multi-layer signal wire line matrix 43 is checked by electrical test.

Referring to FIG. 10A, when no defects are found in the signal wire line matrix 43, the uppermost signal wire line conductive layer 43A is connected to a surface connecting layer 45 through an upper insulating layer 44 to a signal terminal pin 41A via a fixing wire line conductive layer 44A. The fixing wire line layer 44A, in this case, is merely a path for the signal wire line, and does not provide any further function.

However, in the case of a defective signal wire line layer, exemplified by two lines 43A being short-circuited in the short 47. At this time, the fixing wire line conductive layer 44A is cut off at four locations 44A1, 44A2, 44A3 and 44A4. The original surface connecting terminals 45 are connected to the signal terminals pins 41A via fixing re-wired line patterns 445A and 44A6. The re-wired line fixed patterns 44A5 and 44A6 are formed by using the fixing wire line layer 44A, even if the defects occur in some other part of the multi-layer signal wire line matrix 43. Accordingly, it is desirable that a wide selection of wired line patterns can be obtained early in the formation of the fixing signal wired line and at low cost. Photo-lithographic techniques using glass masks are utilized in the normal forming of a wiring pattern. However, forming separate masks each time in the formation of such a fixing wire line pattern necessarily requires much time and is a high cost operation. This problem is resolved in this embodiment by using the direct scanning exposure unit in the step of exposing the resist for manufacturing the fixing signal wire line. That is, only the necessary fixing wire pattern (including the normal fixing wire pattern for a non-defective chip) is directly scanned and thus exposed on the substrate, based on the defect information obtained from the inspection result of the signal wire line matrix 43 in order to produce the fixing signal wire line layer 44A. The fixing patterns 44A5 and 44A6 are directly exposed by the direct scanning exposure unit, as shown in FIG. 10B. The fixing signal wire line can thus be obtained by correcting the resist pattern in the etching and plating steps.

As explained above, in the module built according to the present invention, the metal connecting pad is formed to cover the through hole exposed at the surface, and the multi-layer line matrix is formed on the surface of the multi-layer ceramic substrate including the metal connecting pad. As a result, the connection defect caused by the variation of the rate of construction of the multi-layer ceramic substrate can be prevented. In addition, the via holes can be easily formed. Furthermore, the area of the multi-layer ceramic substrate can be densely and effectively used for an interior power and ground grid. The module of the present invention is formed by using insulating photo-sensitive paste material which is exposed by light incident on the surface of the glass ceramic and which is able to be fired and sintered at a low temperature in air. The glass ceramic has, as an inner conductive layer, the material that was not oxidized in the firing and sintering step in air. For example, gold, silver and palladium, can be used as conductive material for the inner conduction layers of the ceramic substrate, as well as for the conductive material of the multi-layer wire line matrix. As a result, a power wire line with the best impedance can be achieved, and in particular, a high density multi-layer wire line matrix can be formed without limitations on the materials and processes.

The module of the present invention is formed so that the conductive layers that electrically connect the upper and lower conductive layers are different from the upper and low conductive layers, with the result that the cutting of the upper conductive layer is prevented. Using the described manufacturing method for the module, the conductive layer is formed by plating with the result that the formation of the conductive layer is easy. The advantages of the structure arise from the fact that the fixing signal wire line is formed in the signal wire line matrix. The advantages are as follows. First, the check for defective signal wire lines need not be done at each layer of fabrication of the signal wire lines but instead is performed at the time of completing of the wire line matrix. Since the signal wiring has been finished at this stage, the electrical check is straight forward. Next, because the formation of the rewiring pattern can be done by using only a single fixing wire line layer, the fixing is easily accomplished. Then, as the fixing wired line layer is formed as a inner layer, the reliability of the fixing lines is significantly higher than that of fixing wires outside of the substrate.

I claim:

1. The method for manufacturing a module, comprising the steps of:
   forming a ceramic multi-layer substrate by sintering a plurality of laminated green sheet substrates and an included interior power wire line layer, at least one through hole piercing each of said laminated substrates, said formed ceramic substrate having a wire line filling said through hole;
   forming a conductive layer on said ceramic substrate to cover a portion of said wire line passing through said through hole and exposed at a surface of the ceramic substrate; and
   forming an insulating layer on said ceramic substrate to cover a selected portion of the conductive layer and a selected portion of the surface of the ceramic substrate.

2. A method as claimed in claim 1, wherein said step of forming an insulating layer comprises forming a pre-polyimide layer by applying a photo-sensitive pre-polyimide varnish to said ceramic substrate, selectively exposing said applied varnish, and developing said exposed varnish, and then forming a polyimide layer by curing the pre-polyimide layer.

3. A method as claimed in claim 1, wherein said step of forming the ceramic substrate comprises sintering said green sheet substrates at less than 1400° C. in air.

4. A method as claimed in claim 1, wherein said step of forming an insulating layer comprises depositing a photo-sensitive insulating material on said ceramic substrate, selectively patterning said deposited photo-sensitive material and firing and sintering said pattern photo-sensitive material.

5. A method of manufacturing a module, comprising the steps of:
   forming a ceramic multi-layer substrate; and
   forming on top of said substrate a multi-layer wire line matrix, each layer of said multi-layer matrix having an under conductive layer, and an insulating layer formed on the under conductive layer, a forming of said each layer comprising the steps of:
   forming a via hole in a portion of said insulating layer corresponding to a desired portion of the under conductive layer;
   filling said via hole with metal by plating for electrically connecting to the under conductive layers; and
   forming an upper metal on the insulating layer for electrically connecting to the metal filling said via hole.

6. A method as claimed in claim 5, wherein said filling step uses the insulating layer as a plating resist.

7. A method as claimed in claim 6, wherein said filling step comprises passing an electric current through said metal in said via hole.

8. A method of manufacturing a module, comprising the steps of:
   forming a multi-layer wired line layer matrix by alternatively laminating a desired number of conductive layers and a desired number of insulating layers on a substrate;
   detecting if a wire line is defective by inspecting a formed layer of said multi-layer wired line matrix;
   forming a fixing signal wire line layer, if said detecting step has detected said defective wire line, for providing the same function as the function provided by a non-defective wire line; and
   wherein said step of laminating alternatively said desired number of conductive layers and said desired number of insulating layers includes laminating upper ones of said conductive and insulating layers on the fixing signal wire line layer if said detecting step has detected said defective wire line.

* * * * *

UNITED STATES PATENT AND TRADEMARK OFFICE
CERTIFICATE OF CORRECTION

PATENT NO. : 4,736,521

DATED : April 12, 1988

INVENTOR(S) : Dohya

It is certified that error appears in the above-identified patent and that said Letters Patent is hereby corrected as shown below:

COLUMN 4, LINE 46    Delete "wall" and insert --will--;

COLUMN 8, LINE 36    Delete "electrolytic" and insert --non-electrolytic--;

COLUMN 10, LINE 27   Delete "445A" and insert --44A5--.

Signed and Sealed this

Fourth Day of October, 1988

Attest:

DONALD J. QUIGG

*Attesting Officer*    Commissioner of Patents and Trademarks